(12) United States Patent
Strebel Marzano (10) Patent No.: US 11,496,079 B2
(45) Date of Patent: Nov. 8, 2022

(54) COMPACT MOTOR STARTER

(71) Applicant: Rockwell Automation Technologies, Inc., Mayfield Heights, OH (US)

(72) Inventor: Thomas Strebel Marzano, Birmenstorf (CH)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 594 days.

(21) Appl. No.: 16/555,898

(22) Filed: Aug. 29, 2019

(65) Prior Publication Data
US 2021/0067070 A1   Mar. 4, 2021

(51) Int. Cl.
| H02P 1/16 | (2006.01) |
| H02P 6/28 | (2016.01) |
| H02P 29/40 | (2016.01) |
| H02P 6/20 | (2016.01) |

(52) U.S. Cl.
CPC .................. *H02P 6/28* (2016.02); *H02P 6/20* (2013.01); *H02P 29/40* (2016.02)

(58) Field of Classification Search
CPC .. H02P 29/02; H02P 29/40; H02P 6/20; H02P 6/28
See application file for complete search history.

(56) References Cited

U.S. PATENT DOCUMENTS

2013/0037394 A1* 2/2013 Greer ................. H02B 3/00
200/50.24

FOREIGN PATENT DOCUMENTS

| DE | 102007019021 A1 | 11/2007 | |
| DE | 102013113944 A1 * | 6/2014 | ............... H02B 1/04 |
| EP | 2787518 A1 | 10/2014 | |
| WO | 2005101642 A1 | 10/2005 | |
| WO | 2008031699 A1 | 3/2008 | |

OTHER PUBLICATIONS

T Strebel, Timetable Competitor Offerings, Telemecanique Integral 32/63, 1983, 11Pages.
EP Search Report dated Jan. 12, 2021 for EP Application No. 20191838.0.
Siemens, "Sirius 3RA6 Compact Starter Sirius Infeed System for 3RA6," Feb. 2008, 182 pages.
Siemens, "Compact Starter Sirius 3RA6", 2010, 46 pages.

* cited by examiner

*Primary Examiner* — Karen Masih
(74) *Attorney, Agent, or Firm* — Fletcher Yoder, P.C.

(57) ABSTRACT

A motor starter has a housing, a contactor portion disposed within the housing, a motor protection system disposed within the housing adjacent to the contactor portion in a vertical direction, and an actuation system disposed within the housing. The contactor portion may switch between an open position and a closed position, in which, in the open position, current does not flow through the motor starter and, in the closed position, current is allowed to flow through the motor starter. The motor protection system includes a plurality of components that may move the contactor portion to the open position based on a current flow, in which the actuation system may move the contactor portion between the closed position and the open position in response to receiving an input.

20 Claims, 6 Drawing Sheets

COMPACT MOTOR STARTER

BACKGROUND

This disclosure relates generally to motor starters and, more particularly, to motor starters having a reduced footprint.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

A motor starter may be used to deliver power to a motor by electrically coupling the motor to a power supply. The motor starter may also protect the motor from irregularities in the power signal output by the power supply that may shorten a lifespan of the motor. For example, the motor starter may electrically decouple the motor from the power supply upon determining that more than a threshold amount of current is passing through the motor starter. In some embodiments, multiple motor starters may be positioned adjacent to one another, such as within a common enclosure. Accordingly, it may be desirable to reduce the footprint of each motor starter in order to increase the number of motor starters that an enclosure can hold and/or to reduce the volume of the enclosure.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a motor starter includes a housing, a contactor portion disposed within the housing, a motor protection system disposed within the housing adjacent to the contactor portion in a vertical direction, and an actuation system disposed within the housing. The contactor portion may toggle between an open position and a closed position, in which, in the open position, current does not flow through the motor starter and, in the closed position, current is allowed to flow through the motor starter. The motor protection system includes a plurality of components that may move the contactor portion to the open position based on a current flow, in which the actuation system may move the contactor portion between the closed position and the open position in response to receiving an input.

In another embodiment, a system includes a motor, a power supply that may deliver a current flow that includes an alternating-current (AC) voltage waveform to the motor starter, a motor starter that may electrically couple the motor and the power supply. The motor starter includes a housing, a contact disposed within the housing, a motor protection system disposed within the housing, and an actuation system disposed within the housing, in which the contact, the motor protection system, and the actuation system are not integrated in a longitudinal direction. The contact may switch between a closed position and an open position, in which, in the closed position, the contact receives the current flow, such that current flow from the power supply to the motor is enabled, and, in the open position, the contact is disconnected from the current flow. The motor protection system includes a sensor that may determine a value of the current flow and a coil system that may receive at least a portion of the current flow, and the motor protection system may move the contact to the open position based on the current flow. The actuation system may move the contact between the closed position and the open position in response to receiving an input. The motor starter further includes a controller that may instruct the contact to move to the open position based on a characteristic of the AC voltage waveform of the current flow.

In another embodiment, a motor starter includes a housing, a plurality of contacts disposed within the housing, a motor protection system disposed within the housing, and an actuation system disposed within the housing, in which the contactor portion, the motor protection system, and the actuation system are integrated with one another in a vertical direction. Each contact of the plurality of contacts may switch between an open position and a closed position, in which, in the open position, current from a power supply is isolated from the motor starter and, in the closed position, current is conducted to the motor starter. The motor protection system may move the plurality of contacts to the open position via a mechanism based on the current flow. The actuation system may move the plurality of contacts between the closed position and the open position in response to receiving an input. The motor starter further includes a controller that may control actuation of the plurality of contacts between the open position and the closed position based on the current flow, the received input, or both;

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Motor starters are implemented in industrial automation systems to act as an interface between a motor and a power supply. Motor starters may have two primary functions: enable current flow from the power supply to the motor to power the motor, and disable or suspend current flow from the power supply to the motor to protect the motor from irregularities in the current flow from the power supply. For example, the motor starter may include a contactor portion that may provide an electrical connection between the motor and the power supply that may supply the current. As used herein, a contactor portion may include any component, such as a component of a contactor, that may switch between enabling power to be supplied to the motor and disrupting power supply to the motor. The contactor portion may include one or more moveable contacts that electrically couple the motor to the power supply (e.g., in a closed position of the contact(s)) to enable current flow from the power supply to the motor. Further, the contactor portion may electrically decouple the motor from the power supply (e.g., in an open position of the contact(s)) to disrupt current flow from the power supply to the motor. The motor starter may operate with or without user control. In other words, the motor starter may automatically couple and decouple the motor from the power supply without a user manually adjusting the position of the contact(s).

In some embodiments, the contactor portion and the motor protection system may be positioned adjacent to one another in a longitudinal direction of the motor starter. For example, the contactor and the motor protection system may be separate components, coupled to one another to interface with one another. However, this arrangement may increase an equipment footprint of the motor starter where available physical space for placing various items is limited. For example, the motor starter may be positioned on a surface within the enclosure and may occupy an excessive amount of space on the surface. As such, a limited quantity of motor starters may be positioned on the surface, or the motor starters may occupy a greater amount of space than desired.

Accordingly, embodiments of the present disclosure are related to a motor starter having a decreased equipment footprint. By way of example, the motor starter may include a contactor portion and a motor protection system that are integrated in a vertical direction, rather than the longitudinal or horizontal direction, and disposed within a single housing or otherwise packaged together. That is, rather than having a separate contactor or contactor portion and a separate motor protection system coupled to one another, the contactor portion and the motor protection system may be combined into a single collective assembly, and may further reduce the equipment footprint of the motor starter.

Figure 1:
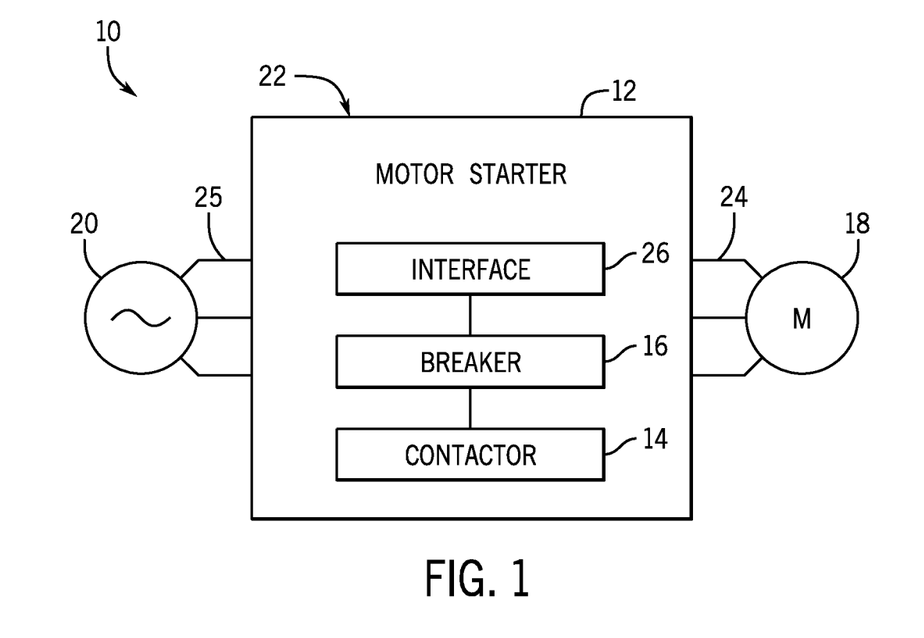
FIG. 1 is a schematic view of an embodiment of an industrial automation system that includes a motor starter having a contactor portion and a motor protection system, in accordance with embodiments of the present disclosure.

Proceeding to the figures, FIG. 1 is a schematic view of an embodiment of an industrial automation system 10 that includes a motor starter 12 having a contactor portion 14 and a motor protection system 16. The motor starter 12 may act as an interface between a motor 18 and a power supply 20 to electrically couple and decouple the motor 18 from the power supply 20. For example, the power supply 20 may supply a current that flows through the contactor portion 14 of the motor starter 12, such that the contactor portion 14 directs the current to the motor 18 to power the motor 18. In some cases, there may be irregularities in the current provided by the power supply 20 and/or by the motor 18 (e.g., phase loss, stall), such that the irregularities may cause undesirable stress on the motor 18. In response, the motor protection system 16 may disrupt the flow of current to the motor 18 to increase a lifespan of the motor 18.

The motor protection system 16 may include an actuation mechanism or component that may physically move the contactor portion 14 from a closed position in which the contactor portion 14 conducts current and an open position in which the contactor portion 14 isolates current from the motor 18. For instance, a determination of irregular current flow through the motor starter 12 may cause the motor protection system 16 to effectuate and disable or suspend current flow through the motor starter 12. Additional details regarding the motor protection system 16 will be discussed herein.

The motor starter 12 may have a motor starter housing 22 that encloses the contactor portion 14 and the motor protection system 16 and separates the motor starter 12 from the motor 18 and the power supply 20. As will be further described herein, the contactor portion 14 and the motor protection system 16 may be arranged in a manner to reduce a size or an equipment footprint of the motor starter housing 22. Additionally, the industrial automation system 10 may include a first set of electrical connections 24 (e.g., wires) to couple the motor 18 to the motor starter 12, and a second set of electrical connections 25 to couple the power supply 20, and therefore the motor 18, to the motor starter 12.

In some embodiments, the motor starter 12 includes an interface 26, which may enable external control of the motor starter 12, such as of the contactor portion 14 and/or the motor protection system 16. In one example, the interface 26 may be a user interface that enables a user or operator to control the motor starter 12 manually. In another example, the interface 26 may be a network interface that communicatively couples the motor starter 12 to a network and enable remote control of the motor starter 12 (e.g., via a computing device).

Figure 2:
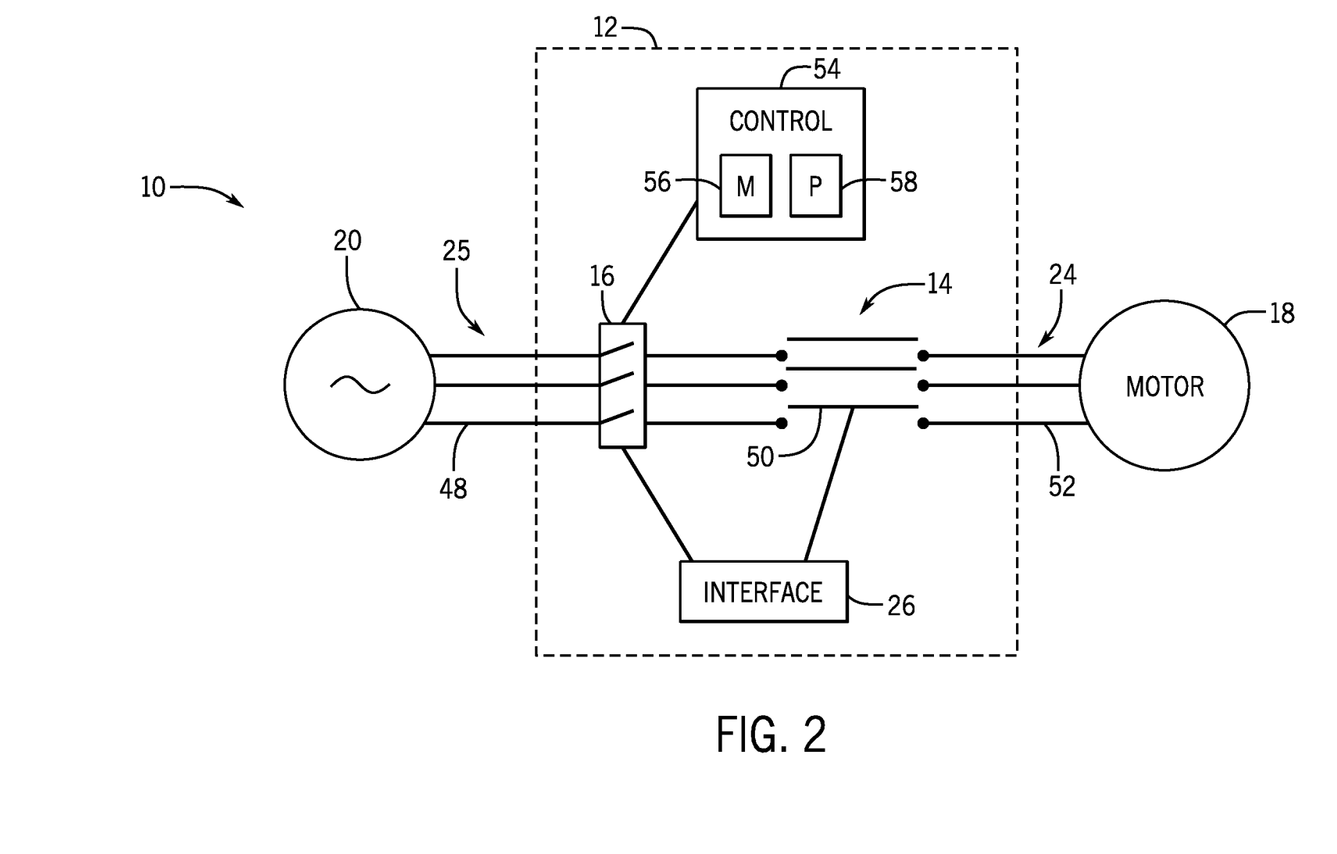
FIG. 2 is a schematic view of an embodiment of the industrial automation system of FIG. 1 showing additional components of the motor starter, in accordance with embodiments of the present disclosure.

FIG. 2 is a schematic view of an embodiment of the industrial automation system 10 providing additional details regarding the components of the motor starter 12. As illustrated, the power supply 20 may provide current to the motor starter 12. As referred to herein, the current provided by the power supply 20 is in the form of a constant three-phase alternating-current (AC) voltage or current waveform, but in additional embodiments, the power supply 20 may provide a different waveform, such as a two-phase AC voltage waveform, a six-phase AC voltage waveform, or the like. In further embodiments, the current may be provided by the power supply 20 in the form of a direct-current (DC) voltage waveform.

In general, the power supply 20 supplies a three-phase AC voltage waveform by delivering three AC voltage waveforms of approximately identical amplitudes and frequencies, but offset by a time difference to one another. That is, each AC voltage waveform alternates between a positive voltage or current amplitude (e.g., maximum voltage or current value) and a negative voltage or current amplitude (e.g., minimum voltage or current value), and crossing a zero voltage or current value between the respective positive and negative voltage amplitudes. Each AC voltage waveform includes substantially the same positive voltage amplitude and substantially the same negative voltage amplitude. Furthermore, each AC voltage waveform approaches the positive voltage amplitude, approaches the negative voltage amplitude, and crosses the zero voltage value at substantially the same frequency (i.e., a quantity per second). However, each AC voltage waveform may not reach the respective positive voltage amplitude, the negative voltage amplitude, and the zero voltage value at the same point in time. For instance, at a single point in time, one of the AC voltage waveforms may be crossing the zero voltage value, another AC voltage waveform may be at a positive voltage value that is less than the positive voltage amplitude, and the remaining AC voltage waveform may be at a negative voltage value that is greater than the negative voltage amplitude. Each AC voltage waveform may be offset by an equal time difference. That is, for example, a first AC voltage waveform may reach its positive voltage amplitude at a first time, a second AC voltage waveform may reach its positive voltage amplitude at a second time, a third AC waveform may reach its positive voltage amplitude at a third time, and the first AC voltage waveform may reach its positive voltage amplitude again at a fourth time. The difference between the first time and the second time, between the second time and the third time, and between the third time and the fourth time are substantially the same time interval.

When the power supply 20 provides current, each AC voltage waveforms of the three-phase AC voltage waveforms is transmitted from the power supply 20 through a respective first electrical connection 48 of the first set of electrical connections 25 to the motor starter 12. In some embodiments, the motor starter 12 may be energized (e.g., powered) to move a respective movable contact system 50 of the contactor portion 14 to the closed position. As used herein, the movable contact system 50 may include components such as a contact, a contact holder, a lever, and so forth, that are adjustable to enable or disrupt current flow through the motor starter 12. In the closed position, the movable contact system 50 electrically couples the first electrical connection 48 with a respective second electrical connection 52 of the second set of electrical connections 24 to enable one of the AC voltage waveforms to flow through the second electrical connection 52 to the motor 18. However, if the motor starter 12 is not energized (e.g., unpowered), the corresponding movable contact system 50 may open and, therefore, the first electrical connection 48 is not electrically coupled to the second electrical connection 52.

The motor protection system 16 may control an operation of the contactor portion 14 to prevent current flow through the movable contact system 50. For example, the motor protection system 16 may cause a component to engage in response to detecting an overload condition (i.e., undesired amount of current flow) and/or a short circuit condition (i.e., excessive current flow) in the motor starter 12. For example, the motor protection system 16 may block a respective AC voltage waveform from flowing through the respective movable contact system 50 to the motor 18, such as upon a determination that the AC voltage waveform is uncharacteristic (e.g., having excessive current). In some embodiments, the motor protection system 16 may be communicatively coupled to a controller 54 that may adjust the movable contact system 50 to enable or disable the current flow through the movable contact system 50 of the contactor portion 14. The controller 54 may include a memory 56 and a processor 58. The memory 45 may be a mass storage device, a flash memory device, removable memory, or any other non-transitory computer-readable medium that includes instructions for the processor 58 to execute, such as instructions to operate the motor protection system 16. The memory 56 may also include volatile memory, such as randomly accessible memory (RAM), and/or non-volatile memory, such as hard disc memory, flash memory, and/or other suitable memory formats. In additional embodiments, the motor protection system 16 may effectuate and move the movable contact system 50 based on a characteristic of the current (e.g., an amount of current flow). By way of example, excessive current will electrically effectuate the motor protection system 16 (i.e., without the use of the controller 54) to open the movable contact system 50 and block the current from flowing through the motor starter 12 to the motor 18. Furthermore, in certain embodiments, the motor starter 12 may additionally include a motor protection system 16 implemented to open the second set of electrical connections 25 to decouple the motor 18 from the motor starter 12.

In some embodiments, the interface 26 may be communicatively coupled to the motor protection system 16 and/or the contactor portion 14. In one example, the interface 26 may enable a user to effectuate the motor protection system 16, such as to block the current from flowing through the motor starter 12 (e.g., manually block the flow of the current), and/or to enable the current to flow through the motor starter 12 (e.g., manually enable current flow to start or restart through the motor starter 12). The interface 26 may, for instance, enable a user to open the contactor portion 14 to block the current from flowing through the motor starter 12.

Figure 3:
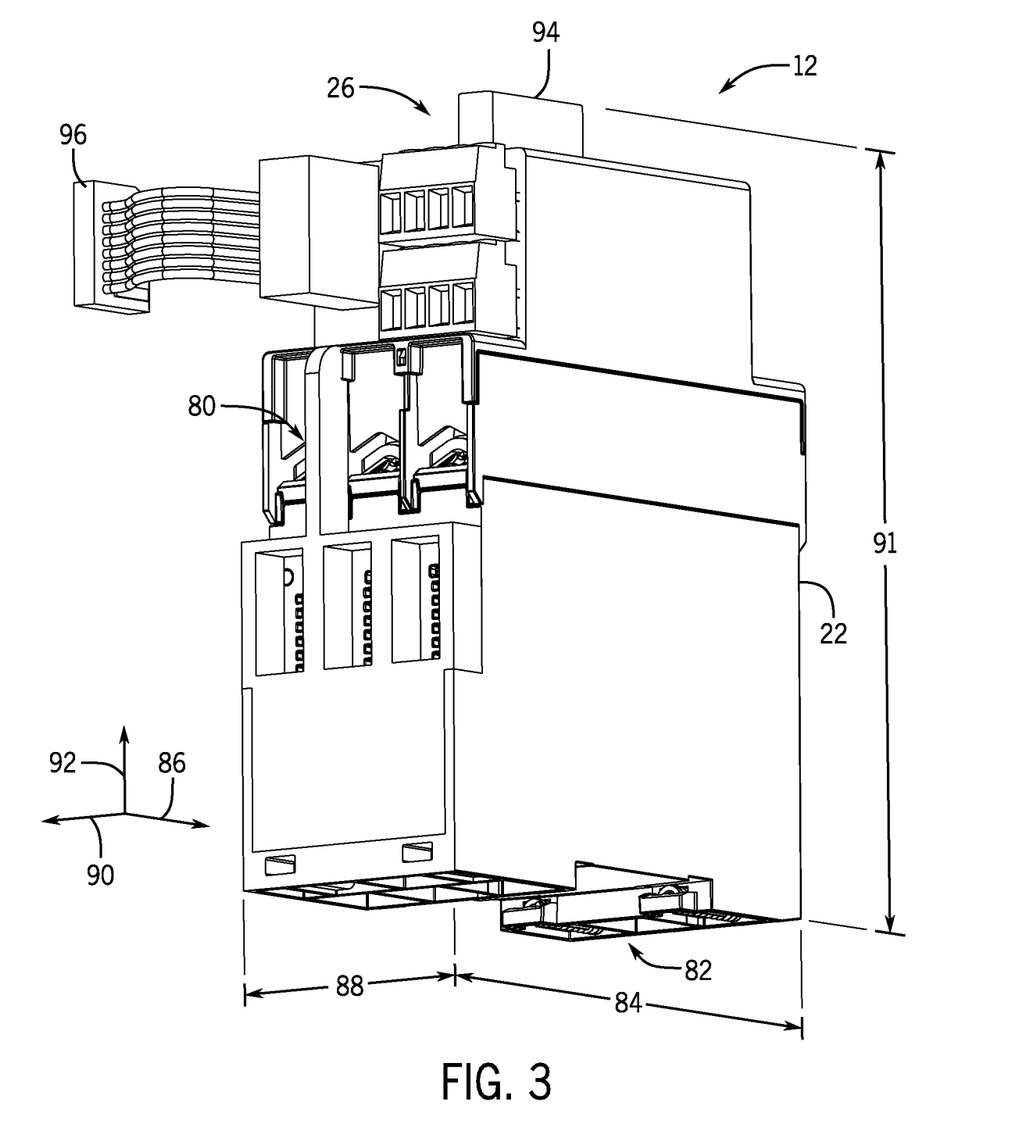
FIG. 3 is a perspective view of an embodiment of the motor starter, in accordance with embodiments of the present disclosure.

FIG. 3 is a perspective view of an embodiment of the motor starter 12 having the motor starter housing 22. The motor starter housing 22 encloses and may block external debris, such as dust, from contacting the contactor portion 14 and the motor protection system 16. The motor starter housing 22 includes terminal openings 80 that enable the motor 18 or the power supply 20 to electrically couple to terminals (not shown) of the motor starter 12. Moreover, the motor starter housing 22 may include a mounting interface 82 that enables the motor starter 12 to couple to another component, such as a control panel enclosure. The motor starter 12 may have a longitudinal length 84 extending in a longitudinal direction 86, a lateral length 88 extending in a lateral direction 90, and a vertical length 91 extending in a vertical direction 92. The longitudinal length 84 may be a value between 80 millimeters (mm) and 120 mm, the lateral length 88 may be a value between 35 mm and 55 mm, and the vertical length 91 may be a value between 150 mm and 170 mm. While attached via the mounting interface 82, the equipment footprint of the motor starter 12 may primarily be based on the longitudinal length 84 and the lateral length 88. In the present disclosure, the contactor portion 14 and the motor protection system 16 may be arranged such that the motor starter housing 22 may be dimensioned to reduce the longitudinal length 84 of the motor starter 12 and, therefore, limiting the equipment footprint of the motor starter 12.

In some embodiments, the interface 26 of the motor starter 12 may be disposed externally to the motor starter housing 22, such as away from the mounting interface 82 in the vertical direction 92. In the illustrated embodiment, the interface 26 includes a user interface 94 that is separate from a network interface 96. In certain embodiments, the user interface 94 may include a component, such as a dial, a switch, a pushbutton, a touchpad, and the like, with which a user may interact to control an operation of the motor starter 12 (e.g., of the contactor portion 14 and/or the motor protection system 16). Moreover, the network interface 96 may couple the motor starter 12 to a network component, such as a router, a network drive, and so forth, and communicatively couple the motor starter 12 with a computing device. As such, a user may control the operation of the motor starter 12 remotely via the computing device.

Figure 4:
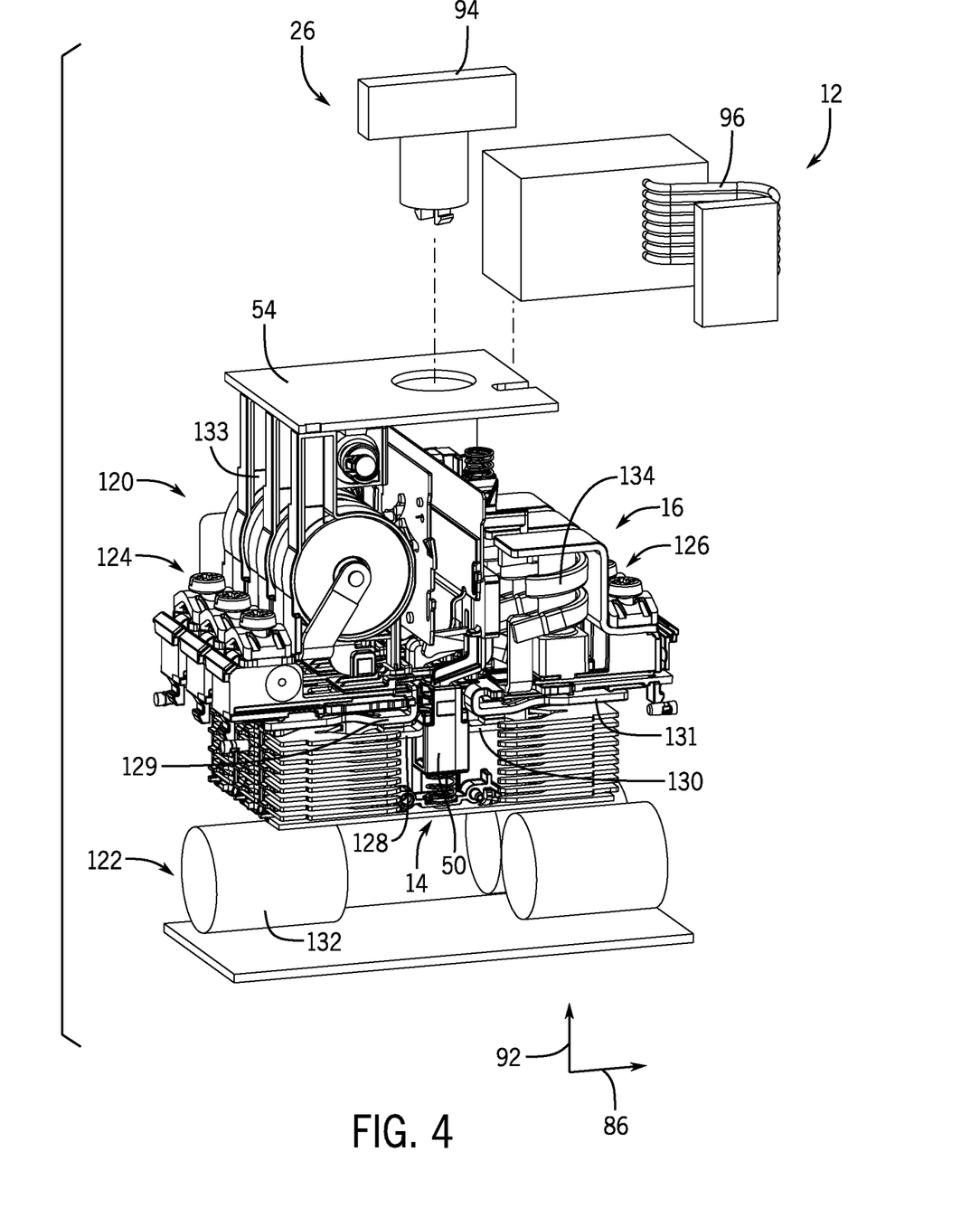
FIG. 4 is an exploded perspective view of an embodiment of the motor starter illustrating internal components of the motor starter, in accordance with embodiments of the present disclosure.

FIG. 4 is an exploded perspective view of the motor starter 12 with the motor starter housing 22 removed to illustrate internal components of the motor starter 12. The motor starter 12 may be divided into three distinct functional sections: the interface 26, a contactor portion and motor protection assembly 120, and an actuation system 122. Each functional section may interact with the other functional sections to maintain operation of the motor starter 12 to enable the power supply 20 to power the motor 18.

The contactor portion and motor protection assembly 120 includes the components that enable the contactor portion 14 and the motor protection system 16 to interact with one another within an integrated system. The illustrated embodiment of the contactor portion and motor protection assembly 120 includes first terminals 124 and second terminals 126. The first terminals 124 and second terminals 126 may each receive the current. In some embodiments, the power supply 20 may electrically couple to the first terminals 124 and the motor 18 may electrically couple to the second terminals 126. Additionally, the power supply 20 may electrically couple to the second terminals 126 and the motor 18 may electrically couple to the first terminals 124.

In order for the current to pass through the motor starter 12, each respective movable contact system 50 may close to electrically couple the respective first terminals 124 to the respective second terminals 126. In certain embodiments, each movable contact system 50 may include a first arm 128 that extends toward first stationary contacts 129 that are electrically coupled to the first terminals 124 and a second arm 130 that extends toward second stationary contacts 131 that are electrically coupled to the second terminals 126. As illustrated in FIG. 4, the first stationary contacts 129 may be positioned below the first terminals 124 in the vertical direction 92, and the second stationary contacts 131 may be positioned below the second terminals 126 along in vertical direction 92. While the movable contact system 50 is closed (e.g., when the current is flowing through the terminals 124, 126), the first arm 128 may engage the first stationary contacts 129 and electrically couple to the first terminals 124, and the second arm 130 may engage the second stationary contacts 131 and electrically couple to the second terminals 126. Therefore, the first terminals 124 may electrically couple to the second terminals 126 such that current may flow through the first terminals 124 and the second terminals 126 via the arms 128, 130 of the movable contact system 50.

For example, the actuation system 122 may close each movable contact system 50 to enable current flow through the motor starter 12. The actuation system 122 may include a plurality of actuators 132, in which each actuator 132 may energize upon receiving a voltage. In some embodiments, each actuator 132 may be electrically coupled to the controller 54, and may be energized based on an activation signal received from the controller 54. For example, a user may input instructions to the controller 54 via the user interface 94 and/or remotely via the network interface 96, such that the instructions cause the controller 54 to send a signal to the actuation system 122 to energize the actuators 132. After the actuators 132 are energized, the contactor portion 14 may move in a direction (e.g., vertical direction 92) to physically engage with the first stationary contacts 129 and second stationary contacts 131. In certain embodiments, the actuators 132 may include a linear actuator, such as a plunger type actuator, a magnetic actuator, a piston type actuator, a sliding wedge type actuator, and the like. Additionally, the actuation system 122 may include other types of actuators 132 to enable current flow through the motor starter 12.

While the movable contact system 50 is open, the first arm 128 may not be engaging the first stationary contacts 129, and the second arm 130 may not be engaging the second stationary contacts 131. For example, the first arm 128 may be positioned between the first terminals 124 and the first stationary contacts 129, and the second arm 130 may be positioned between the second stationary contacts 131 such that the movable contact system 50 is not electrically coupled to the first terminals 124 and the second terminals 126, and the first terminals 124 is not electrically coupled to the second terminals. In this manner, current may not flow through the motor starter 12 when the movable contact system 50 is in the open position.

The motor protection system 16 may open each movable contact system 50. In some embodiments, the motor protection system 16 may include a sensor 133 that determines an overload condition. For example, the sensor 133 may determine a characteristic of the current flowing through one of the first terminals 124. The sensor 133 may be communicatively coupled to the controller 54, in which the controller 54 may adjust the position of each movable contact system 50. For example, the sensor 133 may determine a value of the characteristic of the current and transmit the value to the controller 54. The controller 54 may determine if the value is indicative of an overload condition (e.g., the value exceeds a threshold value) and, in response to determining the value is indicative of the overload condition, the controller 54 may open the corresponding movable contact system 50 to block the current from flowing to the motor 18. Thus, the controller 54 may avoid operating the motor 18 in the overload condition.

The motor protection system 16 may also include a coil system 134 implemented to move as a result of a short circuit condition occurring in the motor starter 12. For example, the coil system 134 may be positioned electrically in series with the terminals 124, 126 and may receive the current flowing through the motor starter 12. If the current flow indicates an excessive current flow, such as when current is unintentionally routed through the motor starter 12 (e.g., the power supply supplies an unintended amount of current), the coil system 134 may effectuate and open the contactor portion 14.

In the illustrated embodiment, the contactor portion and motor protection assembly 120 may be integrated with one another generally in the vertical direction 92. That is, the contactor portion 14 and the motor protection system 16 may be positioned adjacent to one another in the vertical direction 92 to reduce a distance that the motor starter 12 extends in the longitudinal direction 86. Furthermore, the contactor portion 14 and/or the motor protection system 16 may each be structured to reduce a size of the contactor portion and motor protection assembly 120. For example, the contactor portion 14 may share a substantial amount of volume (e.g., each movable contact system 50 is positioned between the sensors 133 and the coil system 134). Thus, the contactor portion and motor protection assembly 120 is further compacted as compared to coupling the contactor portion 14 and the motor protection system 16 together as separate components.

Figure 5:
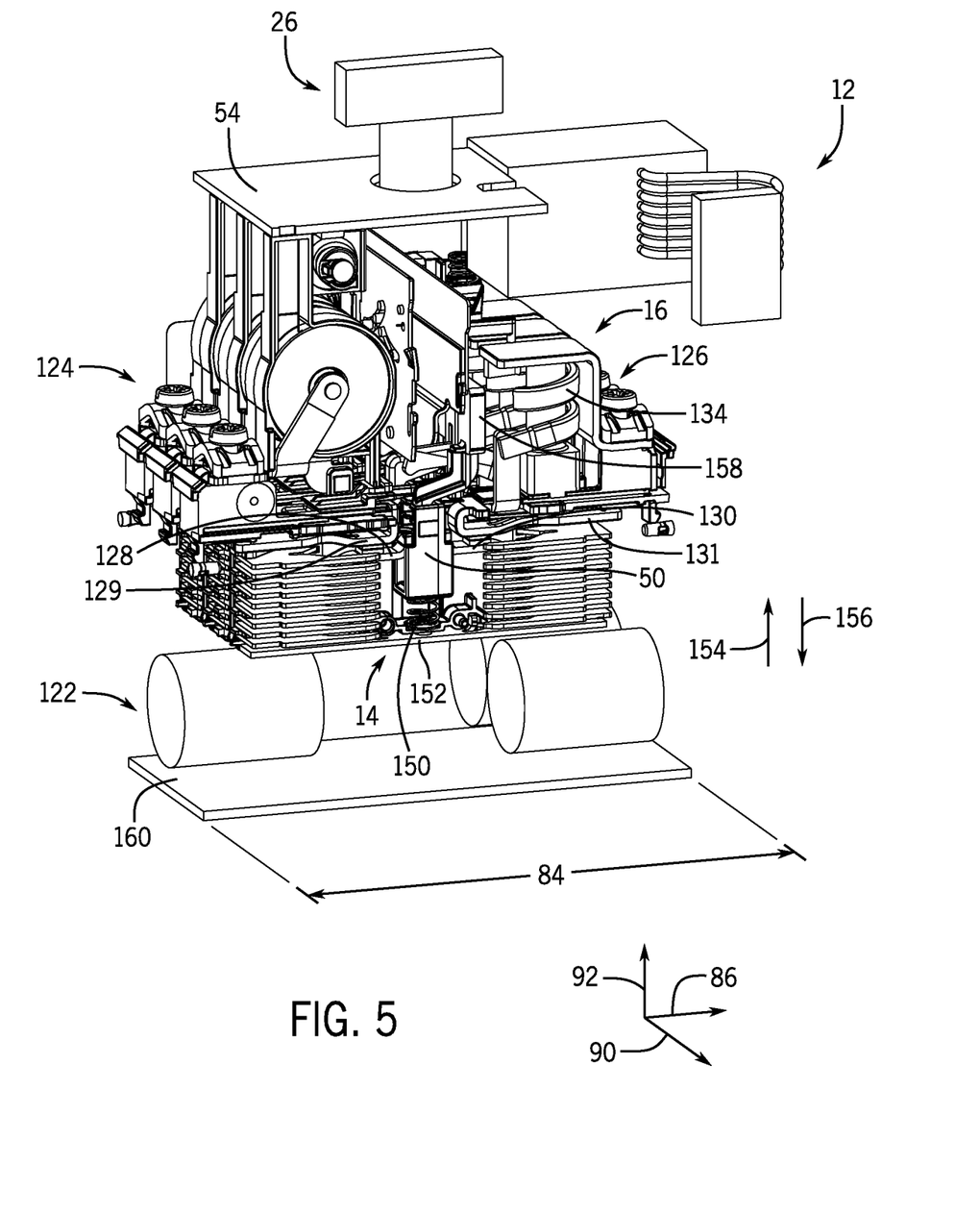
FIG. 5 is a perspective view of an embodiment of the motor starter of FIG. 4 illustrating the interactions between the internals components of the motor starter, in accordance with embodiments of the present disclosure.

FIG. 5 is a perspective view of the motor starter 12 of FIG. 4 that illustrates the interactions between the internals components of the motor starter 12. In the illustrated embodiment, each movable contact system 50 may be coupled to a biasing member 150 (e.g., spring coil) coupling the movable contact system 50 to a stationary base 152. The biasing member 150 may be implemented to impart a force onto the movable contact system 50 to extend the movable contact system 50 in a first direction 154 (e.g., generally upward in the vertical direction 92) toward the first stationary contacts 129 and the second stationary contacts 131 and away from the base 152. As such, the first arm 128 and the second arm 130 are engaging the first stationary contacts 129 and the second stationary contacts 131, respectively. For example, adjustment of the user interface 26 may enable the biasing member 150 to extend the movable contact system 50 in the first direction 154, thereby enabling the movable contact system 50 to close when the actuators 132 are energized (e.g., by the controller 54) Adjustment of the user interface 26 may also block the movable contact system 50 from moving in the direction 154. That is, adjusting the user interface 26 may cause the movable contact system 50 to move in a second direction 156 such that the first arm 128 and the second arm 130 no longer engage the first stationary contacts 129 and the second stationary contacts 131, respectively. As a result, the position of the movable contact system 50 disrupts the flow of current through the motor starter 12, and current may not flow through the motor starter 12 even when the actuators 132 are energized. In some embodiments, each movable contact system 50 is coupled to a respective mechanism 158 that may move the movable contact system 50. The mechanism 158 may be coupled to the controller 54 and/or the coil system 134. As such, the controller 54 and/or the coil system 134 may open the movable contact system 50 and block current flow through the motor starter 12 by moving the mechanism 158. For example, upon determining that the current received by the motor starter 12 is not desirable, the controller 54 may instruct the mechanism 158 to move in the second direction 156 toward the base 152 to open the movable contact system 50.

Furthermore, effectuation of the coil system 134 (e.g., due to excessive current) may cause the coil system 134 to move the mechanism 158 in the second direction 154 toward the base 152 to open the movable contact system 50. As an example, the coil system 134 may receive excessive current that causes the coil system 134 to create a magnetic field. The created magnetic field may physically cause the coil system 134 (e.g., a plunger of the coil system 134) to move (e.g., contract). A large enough current may cause enough movement of the coil system 134 to move the mechanism 158 in the second direction 156 to open the movable contact system 50. As a result, the mechanism 158 may be electrically activated by the current without the use of the controller 54, such that the coil system 134 (e.g., a mechanical connection between the coil system 134 and the mechanism 158) may open the contactor portion 14 more quickly than using the controller 54 to open the contactor portion 14. Additionally, the coil system 134 may move the mechanism 158 in a different manner, such as using components (e.g., bimetals) that bend at a high temperature to cause movement of the mechanism 158.

As should be noted, the mechanism 158 may primarily open the movable contact system 50 during current irregularities, such as overload and/or short circuit conditions. Operation of the motor starter 12 in the presence of current irregularities may shorten a lifespan of the motor 18. Thus, the mechanism 158 may be automatically effectuated upon a determination of a current irregularity to increase the lifespan of the motor 18. Moreover, the actuators 132 may be used to open and close the movable contact system 50 in a controlled manner (e.g., via the interface 26). That is, the position of the movable contact system 50 may be desirably set in either the open position or the closed position by the actuators 132, and the mechanism 158 may be used to override a set closed position of the movable contact system 50 in response to a determination of a current irregularity.

In the illustrated embodiment, the interface 26, the contactor portion 14, the motor protection system 16, and the actuation system 122 are positioned adjacent to one another in the vertical direction 92. In this manner, the motor starter 12 generally extends in the vertical direction 92, rather than in the longitudinal direction 86 that may limit an equipment footprint of the motor starter 12 in the longitudinal direction 86. It should also be noted that the interface 26, the contactor portion 14, the motor protection system 16, and the actuating system 122 may be aligned with one another in a different order than described herein. As an example, although FIGS. 4 and 5 illustrate the actuation system 122 and the contactor portion 14 are positioned below the motor protection system 16 and the contactor portion 14, the actuation system 122 and/or the contactor portion 14 may be positioned above the motor protection system 16 and/or the interface 26 or in any other suitable manner. In additional embodiments of the motor starter 12, the components of the motor starter 12 may be positioned along the lateral direction 90. For example, the contactor portion 14 may be disposed laterally with respect to the motor protection system 16. As such, the motor starter 12 may extend in the lateral direction 90, but the longitudinal length 84 of the motor starter 12 may remain substantially the same to limit the equipment footprint of the motor starter 12 in the longitudinal direction.

In certain embodiments, the controller 54 and/or the coil system 134 may simultaneously open each movable contact system 50 of the contactor portion 14. That is, when the controller 54 determines the current is not desirable and/or if the coil system 134 receives excessive current, the mechanism 158 of each movable contact system 50 may move at approximately the same time such that each movable contact system 50 may open at approximately the same time. In additional embodiments, the motor starter 12 may include a contactor portion controller 160 implemented to open each movable contact system 50 independently at a different time from one another, such as based on the respective AC voltage waveforms (e.g., point on wave control). The contactor portion controller 160 may be the same controller as the controller 54, but the contactor portion controller 160 may alternatively be a controller that is separate from the controller 54. The contactor portion controller 160 may controllably open each movable contact system 50 to limit the effects of opening each movable contact system 50. For example, adjusting the movable contact system 50 when current is flowing through the movable contact system 50 may cause electrical arcs (e.g., current flow through the air) that shorten a lifespan of the motor starter 12 (e.g., by affecting structure of the movable contact system 50). For a motor starter 12 having single contact system, or a single movable contact system 50, and employing the features described herein to compact the size of the motor starter 12, the effects of the structure of the movable contact system 50 may cause frequent replacement of the movable contact system 50. For this reason, in general, the contactor portion controller 160 may open the movable contact system 50 when substantially no current is flowing through the movable contact system 50 to limit the effect that current flow may have on the other components. That is, opening the movable contact system 50 when the AC voltage waveform crosses the zero voltage value reduces or limits the interaction between the current flow and the components of the motor starter 12. In this way, the contactor portion controller 160 may improve the performance of the motor starter 12 and/or increase a lifespan of the motor starter 12, thereby reducing costs associated with implementing and/or operating the motor starter 12.

Figure 6:
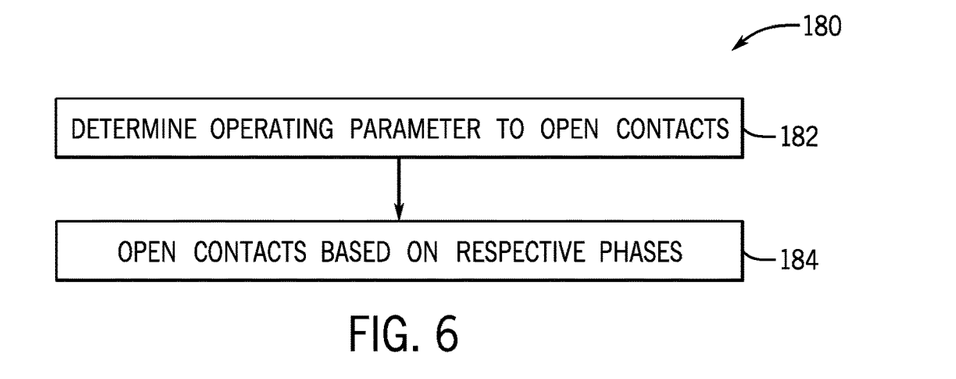
FIG. 6 is a block diagram illustrating an embodiment of a method for opening one or more contacts of a contactor portion of the motor starter in a controlled manner, in accordance with embodiments of the present disclosure.

FIG. 6 is a block diagram illustrating an embodiment of a method or process 180 that may be used by the contactor portion controller 160 to open each movable contact system 50 of the contactor portion 14 in a controlled manner. The method 180 is an exemplary embodiment and similar methods or processes may be used to open each movable contact system 50. For example, similar methods or processes may include additional and/or different steps than the steps illustrated by the method 180.

At block 182, the contactor portion controller 160 determines that the movable contact system 50 (e.g., a contact of the movable contact system 50) of the contactor portion 14 is to be opened. In some embodiments, the contactor portion controller 160 may be communicatively coupled to the controller 54, the sensor 133, the coil system 134, and/or the mechanism 158, and may instruct the contact(s) 50 to open based on a condition of the controller 54, the sensor 133, the coil system 134, and/or the mechanism 158. As such, the contactor portion controller 160 may receive a signal from the controller 54, the sensor 133, the coil system 134 and/or the mechanism 158 indicative that the movable contact system 50 (e.g., a contact of the movable contact system 50) is to be opened. For example, the controller 54 may transmit the signal in response to the controller 54 determining an overload condition. In another example, the sensor 133 may transmit the signal indicative of a characteristic of the current to the contactor portion controller 160, and the contactor portion controller 160 may determine the overload condition based on the signal transmitted by the sensor 133. In a further example, the coil system 134 may transmit the signal in response to receiving an excessive current. In yet another example, the mechanism 158 may transmit the signal when activated by the controller 54 and/or the coil system 134.

In response to receiving the signal, the contactor portion controller 160 may open each movable contact system 50, such as by transmitting a signal to the mechanism 158, at a specific time (block 184). For example, the contactor portion controller 160 may determine the respective AC voltage or current waveforms flowing through each movable contact system 50, and may open each movable contact system 50 via point on wave control, or based on a point on each particular AC voltage or current waveform. In some embodiments, the contactor portion controller 160 may open each movable contact system 50 when the respective AC voltage or current waveforms are approximately at or crossing the zero voltage or current value, or when substantially no voltage is present on or current is flowing through the respective movable contact system 50. As mentioned, opening each movable contact system 50 when substantially no voltage is present on or current is flowing through the respective movable contact system 50 may limit an impact that current flow may have on a performance of the motor starter 12 as a result of a sudden movement of the movable contact system 50, and may increase the lifespan of the motor starter 12 as compared to opening each movable contact system 50 when voltage is present on or current is flowing through the respective movable contact system 50 (e.g., at a non-zero voltage value of the AC voltage waveform). Since the respective AC voltage or current waveforms of the movable contact system 50 may be at or may cross the zero voltage or current value at different points in time, each movable contact system 50 may be opened at a different time than one another, rather than at substantially the same time.

In certain embodiments, the contactor portion controller 160 may also determine the amount of time that elapses between when the contactor portion controller 160 receives the signal to open a particular movable contact system 50 and when the mechanism 158 effectively decouples the particular contact from the first and second stationary contacts 129, 131. The contactor portion controller 160 may factor the amount of time to determine when to instruct the mechanism 158 to open the movable contact system 50 (e.g., relative to when the corresponding AC voltage or current waveform will cross the zero voltage or current value).

Figure 7:
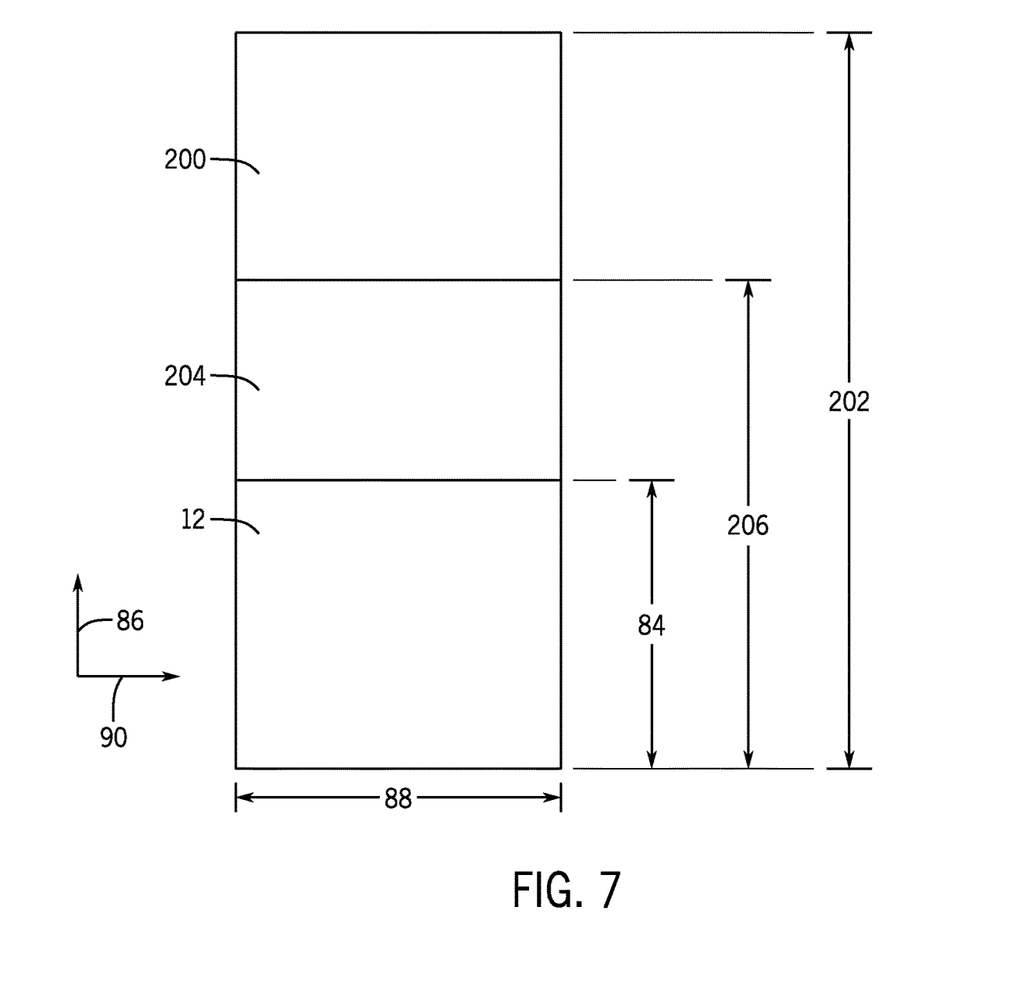
FIG. 7 is a diagram illustrating respective equipment footprints of various motor starter embodiments, in accordance with embodiments of the present disclosure.

FIG. 7 is a diagram illustrating respective equipment footprints of different motor starter embodiments. Particularly, each equipment footprint includes a longitudinal length in the longitudinal direction 86 and a lateral length in the lateral direction 90 for each motor start embodiment. For example, a first motor starter 200, which may be a first motor starter embodiment available in the market, may have a first longitudinal length 202 that is a value between 240 mm and 250 mm. A second motor starter 204, which may be a second motor starter embodiment available in the market, may have a second longitudinal length 206 that is a value between 150 mm and 160 mm. The motor starter 12 of the present disclosure may have the longitudinal length 84 that is between 80 mm and 150 mm, or any combination thereof. As such, the motor starter 12 may occupy a substantially smaller space in the longitudinal direction 86 as compared to the first motor starter 200 and the second motor starter 204. Moreover, as shown in FIG. 7, each motor starter 12, 200, 204 may have substantially the same lateral length 88. As a result, the area occupied by the motor starter 12 based on the longitudinal length 84 and the lateral length 88 is substantially smaller than the respective areas occupied by the first motor starter 200 and the second motor starter 204.

As should be noted, point on wave control (e.g., by the contactor portion controller 160) may increase longevity of the motor starter 12, particularly motor starters 12 using a single contact system, and may enable the particular alignment of the components of the motor starter 12 to be implemented as described herein to limit the longitudinal length 84 between 80 mm and 150 mm. For example, current may continue to flow through air when the position of the movable contact system 50 is adjusted to the open position. The interaction of the current flow through the air with the components of the motor starter 12 may decrease a lifespan of the motor starter 12. However, controlling each movable contact system 50 to open when the respective AC voltage or current waveforms cross the zero voltage or current value may limit the effect of the current flow on the components of the motor starter 12. In other words, opening each movable contact system 50 when substantially no current is flowing through the movable contact system 50 may limit the interaction between the current flow and the other components of the motor starter 12. Thus, the point on wave control certain components of the motor starter 12, such as the movable contact system 50 and the motor protection system 16, to be positioned proximate to one another in the orientation discussed above without reducing a lifespan of the motor starter 12.

In some embodiments, the respective equipment footprints represent an amount of space on a surface occupied by each motor starter 12, 200, 204 when coupled to the surface. The amount of space on the surface occupied by the motor starter 12 in the longitudinal direction 86 is substantially reduced relative to the amount of space on the surface occupied by the first motor starter 200 and the second motor starter 204. As such, in some embodiments, implementing the motor starter 12 may enable placing a greater quantity of motor starters 12 onto the surface as compared to implementing the first motor starter 200 and/or the second motor starter 204. That is, a greater space efficiency may be achieved with use of the motor starter 12. Moreover, the first motor starter 200, the second motor starter 204, and the motor starter 12 may each have the same or similar operational specifications (e.g., power, short circuit rating, lifecycle time), even though the motor starter 12 occupies less space than the first motor starter 200 and the second motor starter 204. In this manner, the motor starter 12 achieves the same operation as compared to the first motor starter 200 and/or the second motor starter 204, while also having a smaller equipment footprint.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A motor starter, comprising:
a housing comprising a mounting interface configured to couple the housing to a surface;
a contactor portion disposed within the housing, wherein the contactor portion is configured to move between an open position and a closed position, wherein, in the open position, current does not flow through the motor starter and, in the closed position, current is allowed to flow through the motor starter;
a motor protection system disposed within the housing, wherein the motor protection system comprises a plurality of components configured to move the contactor portion to the open position based on a current flow, and the contactor portion and the motor protection system are positioned offset from one another along an axis extending away from the mounting interface; and
an actuation system disposed within the housing, wherein the actuation system is configured to move the contactor portion between the closed position and the open position in response to receiving an input.

2. The motor starter of claim 1, wherein the actuation system is disposed within the housing adjacent to the contactor portion and the motor protection system along the axis extending away from the mounting interface.

3. The motor starter of claim 1, wherein the motor protection system comprises a sensor configured to determine a characteristic of the current flow.

4. The motor starter of claim 3, comprising a controller configured to receive the characteristic determined by the sensor, wherein the controller is configured to instruct the motor protection system to actuate the contactor portion to the open position based on the characteristic.

5. The motor starter of claim 1, wherein the motor protection system is configured to actuate a plurality of contacts of the contactor portion to move to the open position in response to determining that the current flow exceeds a threshold value.

6. The motor starter of claim 1, wherein the motor protection system comprises a coil system configured to receive the current flow, wherein the coil system is configured to actuate a plurality of contacts of the contactor portion to the open position in response to receiving an excessive current flow indicated by the current flow.

7. The motor starter of claim 1, wherein the actuation system comprises an electromagnetic actuator configured to drive a plurality of contacts of the contactor portion magnetically between the open position and the closed position.

8. The motor starter of claim 1, comprising a first terminal and a second terminal, wherein the contactor portion comprises a first arm and a second arm, wherein the first arm and the second arm are electrically coupled to the first terminal and the second terminal, respectively, in the closed position, and wherein the first arm and the second arm are not electrically coupled to the first terminal and the second terminal, respectively, in the open position.

9. A system, comprising:
a motor;
a power supply configured to deliver a current flow, wherein the current flow comprises an alternating-current (AC) voltage waveform; and
a motor starter configured to electrically couple to the motor and the power supply, wherein the motor starter comprises:
a housing comprising a mounting interface configured to couple the housing to a surface;
a contact disposed within the housing, wherein the contact is configured to switch between a closed position and an open position, wherein, in the closed position, the contact receives the current flow, such that current flow from the power supply to the motor is enabled, and, in the open position, the contact is disconnected from the current flow;
a motor protection system disposed within the housing, wherein the motor protection system comprises a sensor configured to determine a value of the current flow and a coil system configured to receive at least a portion of the current flow, and wherein the motor protection system is configured to move the contact to the open position based on the current flow;
an actuation system disposed within the housing, wherein the actuation system is configured to move the contact between the closed position and the open position in response to receiving an input; and a controller configured to instruct the contact to move to the open position based on a characteristic of the AC voltage waveform of the current flow;
wherein the contact, the motor protection system, and the actuation system are positioned offset from one another relative to an axis of the housing, the axis extending away from the mounting interface.

10. The system of claim 9, wherein the controller is communicatively coupled to the sensor, and the controller is configured to instruct the contact to move to the open position based on the value of the current flow and the characteristic of the AC voltage waveform.

11. The system of claim 9, comprising an interface configured to receive an additional input from a user, wherein the additional input is indicative of a desired position of the contact.

12. The system of claim 11, wherein the controller is communicatively coupled to the actuation system, wherein the controller is configured to receive the additional input, and wherein the controller is configured to instruct the actuation system to move the contact between the closed position and the open position based on the additional input.

13. The system of claim 9, wherein the motor starter has a longitudinal length between 80 mm and 150 mm.

14. The system of claim 9, wherein the actuation system is positioned between the contact and the mounting interface along the axis.

15. The system of claim 9, wherein the controller is communicatively coupled to the motor protection system, wherein the controller is configured to receive a signal from the motor protection system instructing the controller to move the contact to the open position, and wherein the controller is configured to move the contact to the open position when the AC voltage waveform crosses a zero voltage value in response to receiving the signal from the motor protection system.

16. A motor starter, comprising:
a housing comprising a mounting interface configured to couple the housing to a surface and comprising an axis extending away from the mounting interface;
a plurality of contacts disposed within the housing, wherein each contact of the plurality of contacts is configured to switch between an open position and a closed position, wherein, in the open position, current from a power supply is isolated from the motor starter and, in the closed position, current is conducted to the motor starter;
a motor protection system disposed within the housing, wherein the motor protection system is configured to move the plurality of contacts to the open position via a mechanism based on the current;
an actuation system disposed within the housing, wherein the actuation system is configured to move the plurality of contacts between the closed position and the open position in response to receiving an input; and
a controller configured to control actuation of the plurality of contacts between the open position and the closed position based on the current, the received input, or both;
wherein the plurality of contacts, the motor protection system, and the actuation system are integrated with one another along the axis of the housing.

17. The motor starter of claim 16, wherein the current comprises an alternating-current (AC) voltage waveform or current waveform, wherein the controller is configured to cause the actuation system to move the plurality of contacts to the open position in response to the AC voltage waveform or current waveform crossing a zero voltage value.

18. The motor starter of claim 16, wherein the controller is configured to cause the actuation system to move the plurality of contacts to the open position based on a condition of the motor protection system, the actuation system, or both.

19. The motor starter of claim 16, comprising a sensor configured to monitor a characteristic of the current, wherein the controller is configured to receive feedback indicative of a characteristic determined by the sensor, and the controller is configured to cause the actuation system to move the plurality of contacts to the open position based on the characteristic.

20. The motor starter of claim 16, comprising a biasing member coupled to the plurality of contacts, wherein the biasing member is configured to bias the plurality of contacts to the open position.

* * * * *